United States Patent
Seki et al.

(10) Patent No.: US 9,936,559 B2
(45) Date of Patent: Apr. 3, 2018

(54) LIGHT-EMITTING DEVICE

(71) Applicants: Pioneer Corporation, Kawasaki-shi, Kanagawa (JP); Tohoku Pioneer Corporation, Tendo-shi, Yamagata (JP)

(72) Inventors: Shuichi Seki, Yonezawa (JP); Shigehiro Umetsu, Yonezawa (JP); Hiroki Tan, Yonezawa (JP); Katsuhiro Kanauchi, Yonezawa (JP)

(73) Assignees: PIONEER CORPORATION, Tokyo (JP); TOHOKU PIONEER CORPORATION, Yamagata (JP)

( * ) Notice: Subject to any disclaimer, the term of this patent is extended or adjusted under 35 U.S.C. 154(b) by 0 days.

(21) Appl. No.: 15/204,211

(22) Filed: Jul. 7, 2016

(65) Prior Publication Data

US 2016/0323965 A1 Nov. 3, 2016

Related U.S. Application Data

(63) Continuation of application No. 14/426,121, filed as application No. PCT/JP2012/072556 on Sep. 5, 2012, now Pat. No. 9,420,662.

(51) Int. Cl.
*H05B 33/08* (2006.01)
*H01L 51/50* (2006.01)
(Continued)

(52) U.S. Cl.
CPC ..... *H05B 33/0896* (2013.01); *H01L 27/3218* (2013.01); *H01L 51/504* (2013.01);
(Continued)

(58) Field of Classification Search
CPC ............ H01L 27/3218; H01L 51/5036; H01L 51/504; H05B 37/00; H05B 33/0857; H05B 33/14
(Continued)

(56) References Cited

U.S. PATENT DOCUMENTS 6,565,231 B1 5/2003 Cok
8,080,934 B2 12/2011 Kido et al.
(Continued)

FOREIGN PATENT DOCUMENTS

JP 2001313172 A 11/2001
JP 2003045676 A 2/2003
(Continued)

OTHER PUBLICATIONS

International Search Report for PCT/JP2012/072556, dated Dec. 11, 2012.
Office Action for corresponding JP App dated Apr. 25, 2017.

*Primary Examiner* — Jimmy Vu
(74) *Attorney, Agent, or Firm* — Procopio, Cory, Hargreaves & Savitch LLP

(57) ABSTRACT

A light-emitting device (10) includes a first light-emitting region (100) and a second light-emitting region (200). The first light-emitting region (100) emits a light ray having a first color by making a first light-emitting layer group including at least two or more kinds of light-emitting layers emit light. In addition, the second light-emitting region (200) emits a light ray having the first color (for example, daylight color, natural white color, white color, warm white color, or incandescent color) by making a second light-emitting layer group including at least two or more kinds of light-emitting layers emit light. In addition, at least one kind of light-emitting layer included in the second light-emitting layer group emits a light ray having a different spectrum peak from all of the light-emitting layers included in the first light-emitting layer group. Therefore, the color-rendering properties of light emitted from the light-emitting device (10) are improved.

11 Claims, 12 Drawing Sheets

(51) Int. Cl.
  *H01L 27/32* (2006.01)
  *H05B 33/14* (2006.01)
(52) U.S. Cl.
  CPC ..... *H01L 51/5036* (2013.01); *H05B 33/0857* (2013.01); *H05B 33/14* (2013.01); *H01L 2251/5361* (2013.01)
(58) Field of Classification Search
  USPC ............. 315/185 R, 186, 291, 307, 308, 312
  See application file for complete search history.

(56) References Cited

U.S. PATENT DOCUMENTS

| | | | |
|---|---|---|---|
| 8,482,193 B2 | 7/2013 | Kido et al. | |
| 9,420,662 B2 * | 8/2016 | Seki ..................... | H01L 51/504 |
| 2001/0022496 A1 | 9/2001 | Kobayashi et al. | |
| 2004/0032205 A1 | 2/2004 | Hack et al. | |
| 2006/0040132 A1 | 2/2006 | Liao et al. | |
| 2007/0085070 A1 | 4/2007 | Sakata | |
| 2007/0182317 A1 | 8/2007 | Kido et al. | |
| 2008/0130278 A1 | 6/2008 | Ushikubo et al. | |
| 2010/0102736 A1 | 4/2010 | Hessling | |
| 2012/0132895 A1 | 5/2012 | Kido et al. | |
| 2014/0151648 A1 | 6/2014 | Kido | |

FOREIGN PATENT DOCUMENTS

| | | | |
|---|---|---|---|
| JP | 2003272860 A | | 9/2003 |
| JP | 2004031341 A | | 1/2004 |
| JP | 2006-504231 A | | 2/2006 |
| JP | 2007-059272 A | | 3/2007 |
| JP | 2007-141822 | * | 6/2007 |
| JP | 2007141822 A | | 6/2007 |
| JP | 2008511100 A | | 4/2008 |
| JP | 2008-159577 | * | 7/2008 |
| JP | 2008159577 A | | 7/2008 |
| JP | 2009-224274 | * | 10/2009 |
| JP | 2009224274 A | | 10/2009 |
| JP | 2010272886 A | | 12/2010 |
| WO | 2004017678 A2 | | 2/2004 |

* cited by examiner

240(212, 222, 232)

200

LIGHT-EMITTING DEVICE

This application is a continuation application of U.S. application Ser. No. 14/426,121, filed Mar. 4, 2015, which is a National Stage entry of PCT/JP2012/072556, filed on Sep. 5, 2012.

TECHNICAL FIELD

The present invention relates to a light-emitting device.

BACKGROUND ART

Recently, studies have been conducted to use a light-emitting element such as an organic electro-luminescent element as a light source for lighting apparatuses. One of the characteristics required of the lighting apparatuses is the emission of white light. For example, Patent Document 1 describes that, as shown in FIG. 1, regions 520 emitting red light, regions 530 emitting green light, and regions 540 emitting blue light are formed on a single substrate, and the regions are made to emit light at the same time, whereby white light is emitted.

Patent Document 2 describes a lighting apparatus including multiple panel-shaped organic light-emitting sources.

In addition, Patent Documents 3 and 4 describe the lamination of multiple organic EL light-emitting layers between an anode and a cathode. These documents describe that a charge-generating layer is provided between each of the multiple organic EL light-emitting layers.

RELATED DOCUMENT

Patent Document

[Patent Document 1] Japanese Unexamined Patent Publication No. 2010-272886
[Patent Document 2] Japanese Unexamined Patent Publication No. 2004-31341
[Patent Document 3] Japanese Unexamined Patent Publication No. 2003-272860
[Patent Document 4] Japanese Unexamined Patent Publication No. 2003-45676

DISCLOSURE OF THE INVENTION

The improvement of color-rendering properties is one of the characteristics required of light-emitting devices used as lighting. An example of problems the present invention intends to solve is the improvement of color-rendering properties.

According to Claim 1 of the present invention, there is provided a light-emitting device including:
a first light-emitting region including a first light-emitting layer group constituted of multiple kinds of light-emitting layers emitting light rays having mutually different spectrum peaks; and
a second light-emitting region including a second light-emitting layer group constituted of multiple kinds of light-emitting layers emitting light rays having mutually different spectrum peaks,
in which at least one kind of light-emitting layer in the second light-emitting layer group emits a light ray having a different spectrum peak from all of the light-emitting layers in the first light-emitting group, the first light-emitting region emits a light ray having a first color by making the first light-emitting layer group emit light, and
the second light-emitting region emits a light ray having the first color by making the second light-emitting layer group emit light.

BRIEF DESCRIPTION OF THE DRAWINGS

The above-described object, other objects, characteristics, and advantages will be further clarified by preferred embodiments described below and the following accompanying drawings.

DESCRIPTION OF EMBODIMENTS

Figure 1:
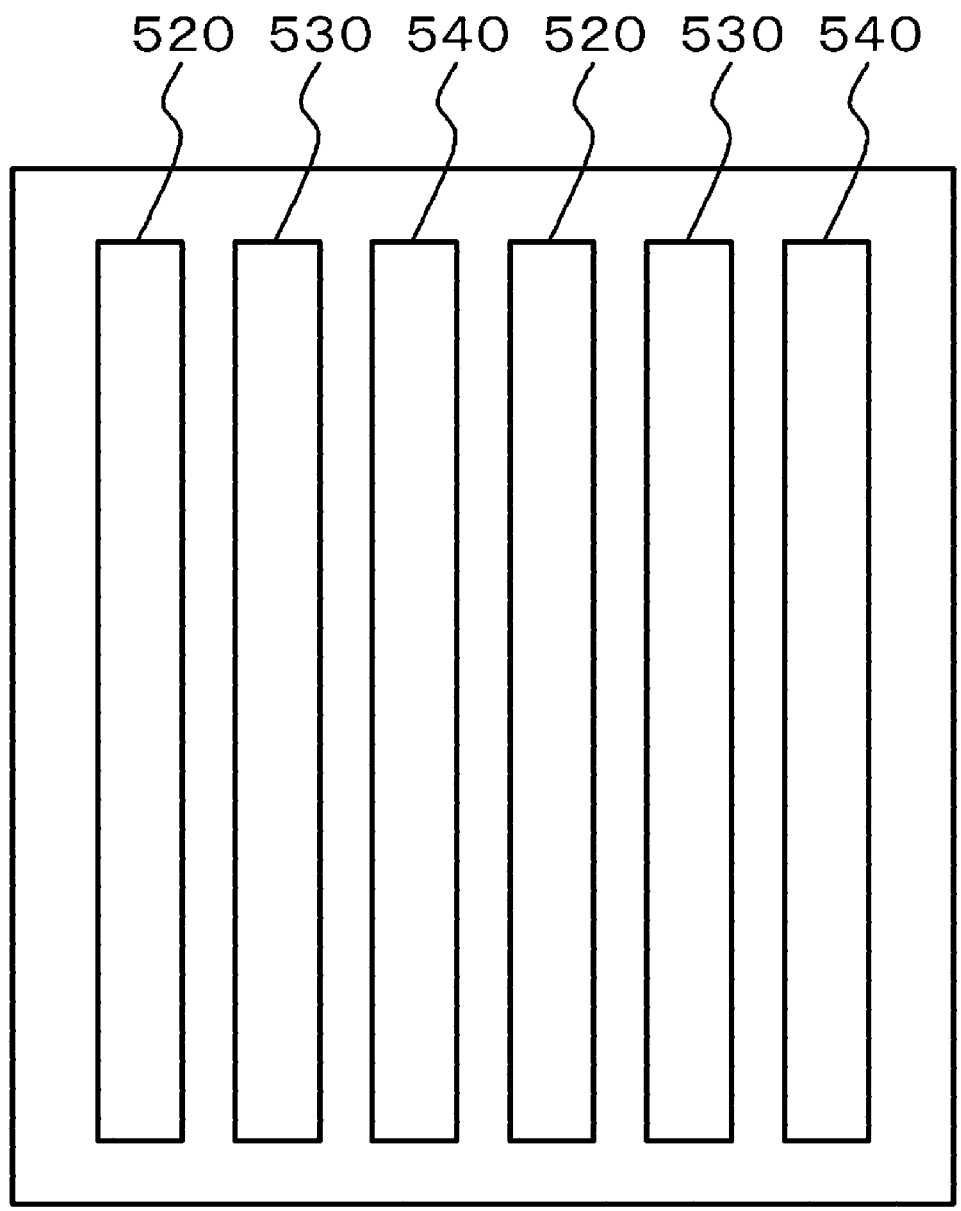
FIG. 1 shows a plan view showing described in Patent Document 1.

Hereinafter, embodiments of the present invention will be described using the drawings. In all of the drawings, similar components will be given similar reference numerals, and description thereof will not be repeated.

In the following embodiments, the same color is defined as a color included in a predetermined range in the xy chromaticity diagram or a color having a chromaticity in a predetermined range, that is, a region included in chromaticitys in the same color range. As the predetermined range, for example, a range defined by JIS can be used. For example, daylight color, natural white color, white color, warm white color, and incandescent color are as defined by JIS Z9112. According to this definition, the daylight color belongs to a region surrounded by a box having vertexes at (0.3274, 0.3673), (0.3282, 0.3297), (0.2998, 0.3396), and (0.3064, 0.3091) in the xy chromaticity diagram, and has a correlated chromaticity $T_{cp}$ in a range of 5700 (K) to 7100 (K). The natural white color belongs to a region surrounded by a box having vertexes at (0.3616, 0.3875), (0.3552, 0.3476), (0.3326, 0.3635), and (0.3324, 0.3296) in the xy chromaticity diagram, and has a correlated chromaticity $T_{cp}$ in a range of 4600 (K) to 5500 (K). The white color belongs to a region surrounded by a box having vertexes at (0.3985, 0.4102), (0.3849, 0.3668), (0.3652, 0.3880), and (0.3584, 0.3499) in the xy chromaticity diagram, and has a correlated chromaticity $T_{cp}$ in a range of 3800 (K) to 4500 (K). The warm white color belongs to a region surrounded by a box having vertexes at (0.4305, 0.4218), (0.4141, 0.3834), (0.3966, 0.4044), and (0.3856, 0.3693) in the xy chromaticity diagram, and has a correlated chromaticity $T_{cp}$ in a range of 3250 (K) to 3800 (K). The incandescent color belongs to a region surrounded by a box having vertexes at (0.4834, 0.4832), (0.4594, 0.3971), (0.4305, 0.4218), and (0.4153, 0.3862) in the xy chromaticity diagram, and has a correlated chromaticity $T_{cp}$ in a range of 2600 (K) to 3250 (K).

(First Embodiment)

Figure 2:
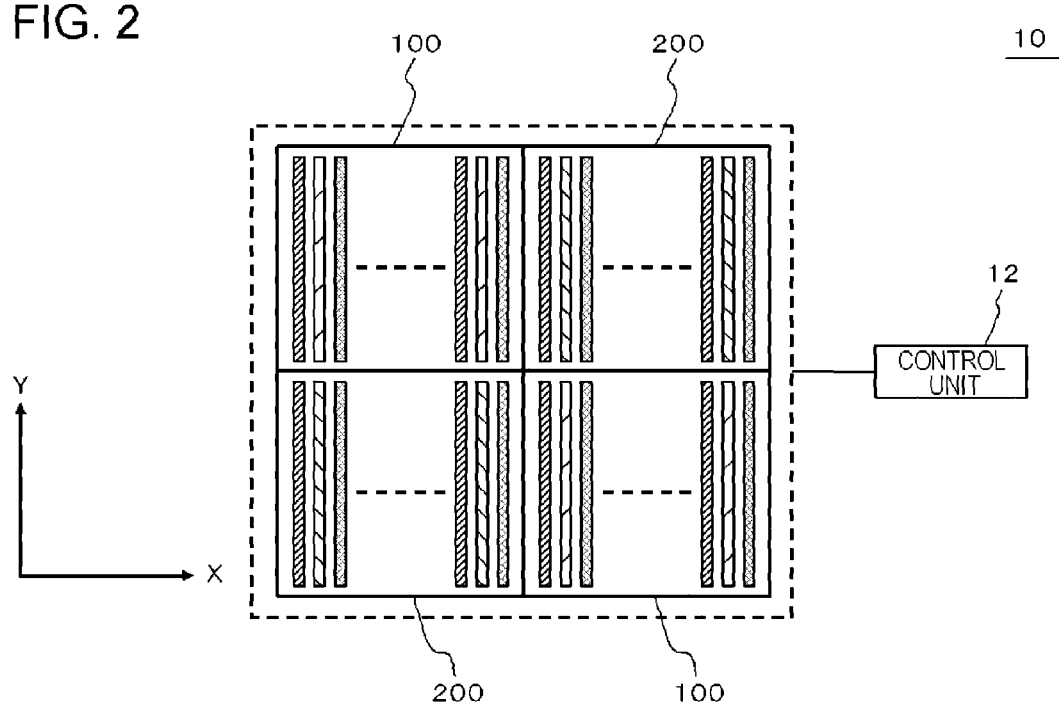
FIG. 2 is a plan view showing the constitution of a light-emitting device 10 according to a first embodiment.
Figure 3:
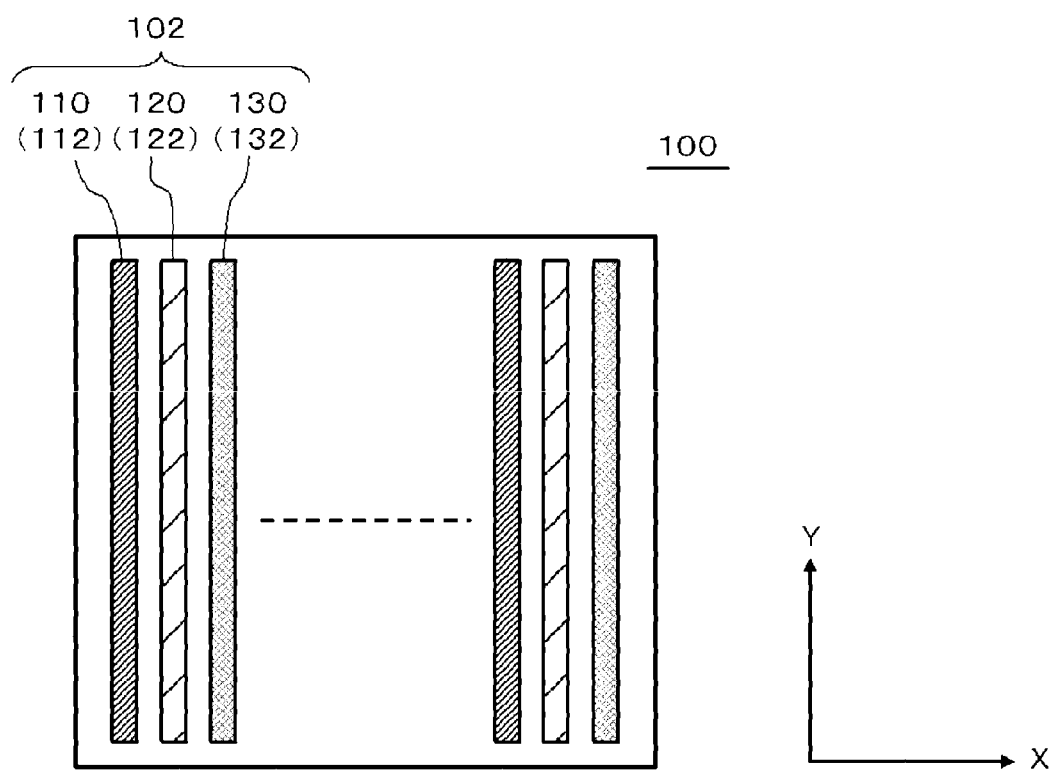
FIG. 3 is a plan view showing the constitution of a first light-emitting region 100.
Figure 4:
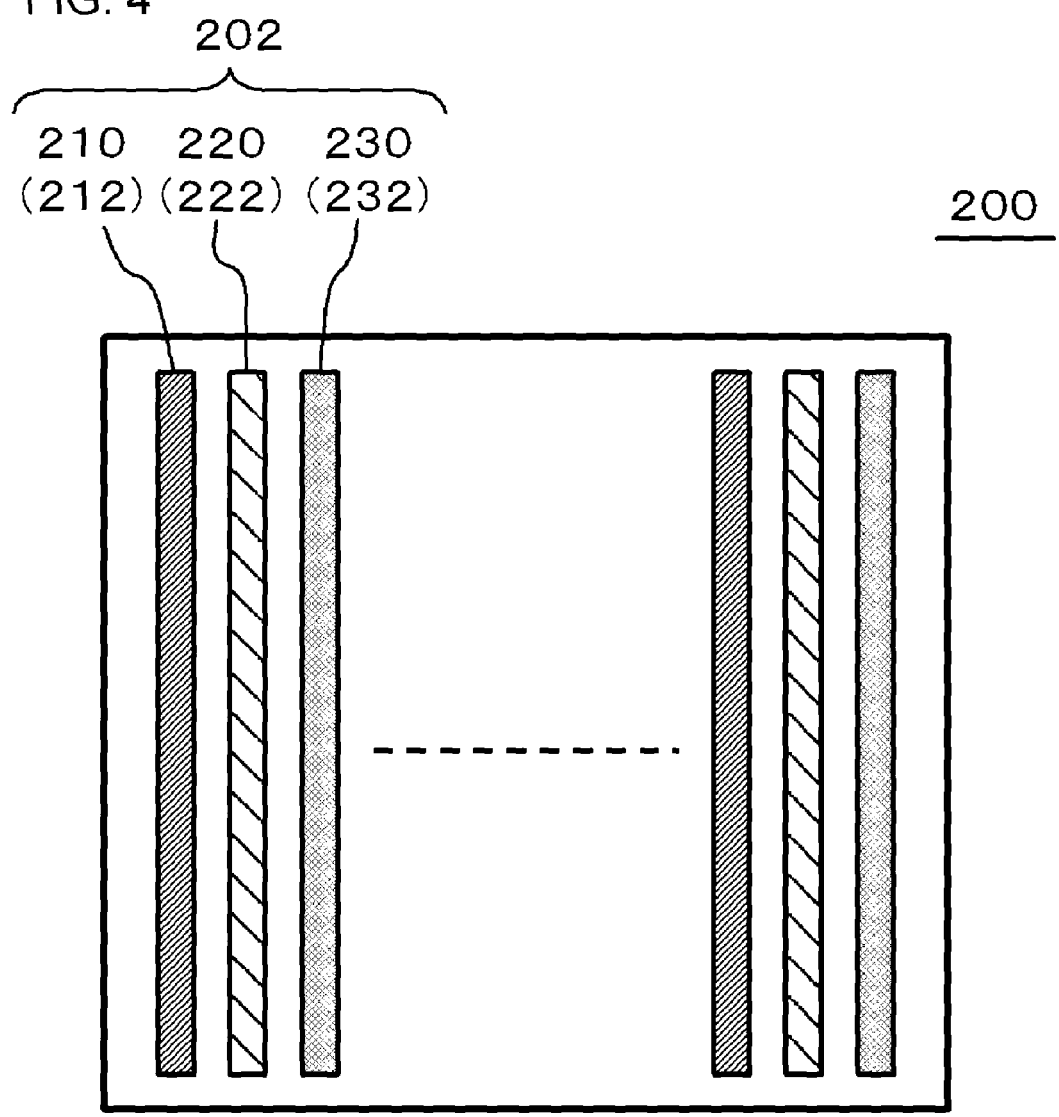
FIG. 4 is a plan view showing the constitution of a second light-emitting region 200.

FIG. 2 is a plan view showing the constitution of a light-emitting device 10 according to a first embodiment. FIG. 3 is a plan view showing the constitution of a first light-emitting region 100 included in the light-emitting device 10. FIG. 4 is a plan view showing the constitution of a second light-emitting region 200 included in the light-emitting device 10.

As shown in FIG. 2, the light-emitting device 10 includes the first light-emitting region 100 and the second light-emitting region 200. The first light-emitting region 100 includes a first light-emitting layer group 102 as shown in FIG. 3. The first light-emitting layer group 102 includes a light-emitting layer 112, a light-emitting layer 122, and a light-emitting layer 132. These multiple kinds of light-emitting layers emit light rays having mutually different spectrum peaks. The second light-emitting region 200 includes a second light-emitting layer group 202 as shown in FIG. 4. The second light-emitting layer group 202 includes a light-emitting layer 212, a light-emitting layer 222, and a light-emitting layer 232. These multiple kinds of light-emitting layers emit light rays having mutually different spectrum peaks. In addition, at least one kind of light-emitting layer included in the second light-emitting layer group 202 emits a light ray having a different spectrum peak from all of the light-emitting layers in the first light-emitting layer group 102. For example, the light-emitting layers constituting the first light-emitting layer group 102 have mutually different wavelengths at which the light-emitting intensities reach the maximum. The light-emitting layers constituting the second light-emitting layer group 202 also have mutually different wavelengths at which the light-emitting intensities reach the maximum. In addition, at least one kind of light-emitting layer included in the second light-emitting layer group 202 has a different wavelength, at which the light-emitting intensity reaches the maximum, from all of the light-emitting layers included in the first light-emitting layer group 102.

The first light-emitting region 100 emits alight ray having the first color by making the first light-emitting layer group 102 emit light. In addition, the second light-emitting region 200 also emits a light ray having the first color (for example, the daylight color, the natural white color, the white color, the warm white color, or the incandescent color) by making the second light-emitting layer group 202 emit light. When the light ray having the first color is emitted, in the second light-emitting region 200, at least a light-emitting layer emitting a light ray having a different spectrum peak from all of the light-emitting layers included in the first light-emitting layer group 102 is made to emit light. Therefore, the color-rendering properties of light emitted from the light-emitting device 10 are improved.

A light ray emitted from the first light-emitting region 100 and a light ray emitted from the second light-emitting region 200 have different spectrum peaks. However, the chromaticity of the first color emitted from the first light-emitting region 100 and the chromaticity of the first color emitted from the second light-emitting region 200 are located in a range of the same color in the xy chromaticity diagram. The range of the same color mentioned herein refers to, for example, a range defined by JIS Z9112. Therefore, both light rays are recognized as the same color to the human eye. Hereinafter, details thereof will be described.

First, the light-emitting device 10 will be described using FIG. 2. In the present embodiment, the first light-emitting region 100 is a first light-emitting panel, and the second light-emitting region 200 is a second light-emitting panel. That is, the first light-emitting layer group 102 and the second light-emitting layer group 202 are formed on mutually different substrates. In the example shown in the present drawing, the first light-emitting region 100 and the second light-emitting region 200 are disposed alternately in each of two directions (the X direction and the Y direction in the drawing).

In the first light-emitting region 100, the first light-emitting layer group 102 includes multiple light-emitting layers formed in a striped pattern. That is, the multiple light-emitting layers constituting the first light-emitting layer group 102 are formed in mutually different regions in planar view. In addition, in the second light-emitting region 200, the second light-emitting layer group 202 includes multiple light-emitting layers formed in a striped pattern. That is, the multiple light-emitting layers constituting the second light-emitting layer group 202 are formed in mutually different regions in planar view. Therefore, it is possible to select only desired kinds of light-emitting layers and make them emit light. In addition, the planar shape of the multiple light-emitting layers belonging to the first light-emitting layer group 102 and the planar shape of the multiple light-emitting layers belonging to the second light-emitting layer group 202 both have striped patterns. Therefore, it is possible to highly densely dispose the multiple light-emitting layers in the first light-emitting region 100, and it is possible to highly densely dispose the multiple light-emitting layers in the second light-emitting region 200.

The light-emitting layers included in the first light-emitting region 100 and the light-emitting layers included in the second light-emitting region 200 are, for example, organic EL light-emitting layers, but may be other light-emitting layers (for example, light-emitting diodes (LED)).

Voltages or currents applied to the respective light-emitting layers are controlled using a control unit 12. The control unit 12 is, for example, a display driver. In this case, the control unit 12 mutually independently controls the light-emitting intensities of the multiple light-emitting layers included in the first light-emitting layer group 102. Therefore, the control unit 12 is capable of changing the color of light emitted from the first light-emitting region 100. In addition, the control unit 12 controls the relative ratio of the light-emitting intensities of the multiple light-emitting layers included in the second light-emitting layer group 202, whereby it is possible to change the color of light emitted from the second light-emitting region 200.

In a case in which the colors of light rays emitted from the first light-emitting region 100 and the second light-emitting region 200 may be fixed, the control unit 12 may be formed of a circuit through which predetermined voltages are respectively applied to the light-emitting layers included in the first light-emitting region 100 and the light-emitting layers included in the second light-emitting region 200, for example, multiple resistance elements provided in parallel to each other.

Next, the constitution of the first light-emitting region 100 will be described using FIG. 3. The first light-emitting region 100 includes light-emitting elements 110, 120, and 130. The light-emitting elements 110, 120, and 130 are formed in a striped pattern, and extend in a first direction (the y direction in the drawing). In addition, a sequence of the light-emitting elements 110, 120, and 130 is repeatedly disposed in a second direction (the x direction in the drawing) orthogonal to the first direction.

The light-emitting element 110 includes the light-emitting layer 112, the light-emitting element 120 includes the light-emitting layer 122, and the light-emitting element 130 includes the light-emitting layer 132. The light-emitting layers 112, 122, and 132 constitute the first light-emitting layer group 102, and emit mutually different colors. For example, the combination of the colors of light rays emitted from the light-emitting layers 112, 122, and 132 may be red, green, and blue, or red, yellow, and blue, or may be magenta, yellow, and cyan or red, cyan, and blue.

Next, the constitution of the second light-emitting region 200 will be described using FIG. 4. The second light-emitting region 200 includes light-emitting elements 210, 220, and 230. The light-emitting elements 210, 220, and 230 are formed in a striped pattern, and extend in the first direction (the y direction in the drawing). In addition, a sequence of the light-emitting elements 210, 220, and 230 is repeatedly disposed in the second direction (the x direction in the drawing) orthogonal to the first direction.

The light-emitting element 210 includes the light-emitting layer 212, the light-emitting element 220 includes the light-emitting layer 222, and the light-emitting element 230 includes the light-emitting layer 232. The light-emitting layers 212, 222, and 232 constitute the second light-emitting layer group 202, and emit mutually different colors.

At least one of the light-emitting layers 212, 222, and 232 emits a light ray having a different color from all of the light-emitting layers 112, 122, and 132 in the first light-emitting region 100.

For example, in a case in which the combination of the colors of light rays emitted from the light-emitting layers 112, 122, and 132 in the first light-emitting region 100 is red, green, and blue, the combination of the colors of light rays emitted from the light-emitting layers 212, 222, and 232 in the second light-emitting region 200 is red, yellow, and blue. In this case, both the first light-emitting region 100 and the second light-emitting region 200 are capable of emitting the daylight color, the natural white color, the white color, the warm white color, or the incandescent color. Meanwhile, the combination of the colors of light rays emitted from the light-emitting layers 212, 222, and 232 in the second light-emitting region 200 may be magenta, yellow, and cyan, or red, cyan, and blue.

In addition, in a case in which the combination of the colors of light rays emitted from the light-emitting layers 112, 122, and 132 in the first light-emitting region 100 is red, yellow, and blue, the combination of the colors of light rays emitted from the light-emitting layers 212, 222, and 232 in the second light-emitting region 200 is red, green, and blue, or magenta, yellow, and cyan, or red, cyan, and blue.

In addition, in a case in which the combination of the colors of light rays emitted from the light-emitting layers 112, 122, and 132 in the first light-emitting region 100 is magenta, yellow, and cyan, the combination of the colors of light rays emitted from the light-emitting layers 212, 222, and 232 in the second light-emitting region 200 is red, green, and blue, red, yellow, and blue, or red, cyan, and blue.

In addition, in a case in which the combination of the colors of light rays emitted from the light-emitting layers 112, 122, and 132 in the first light-emitting region 100 is red, cyan, and blue, the combination of the colors of light rays emitted from the light-emitting layers 212, 222, and 232 in the second light-emitting region 200 is red, green, and blue, red, yellow, and blue, or magenta, yellow, and cyan.

The combination of the colors of light rays emitted from the light-emitting layers 212, 222, and 232 in the second light-emitting region 200 may be the same as the combination of the colors of light rays emitted from the light-emitting layers 112, 122, and 132 in the first light-emitting region 100. Even in this case, the spectrum peak of a light ray emitted from at least one of the light-emitting layers 212, 222, and 232 is different from those emitted from the light-emitting layers 112, 122, and 132. In this case as well, it is possible to improve the color-rendering properties of the light-emitting device 10.

Figure 5:
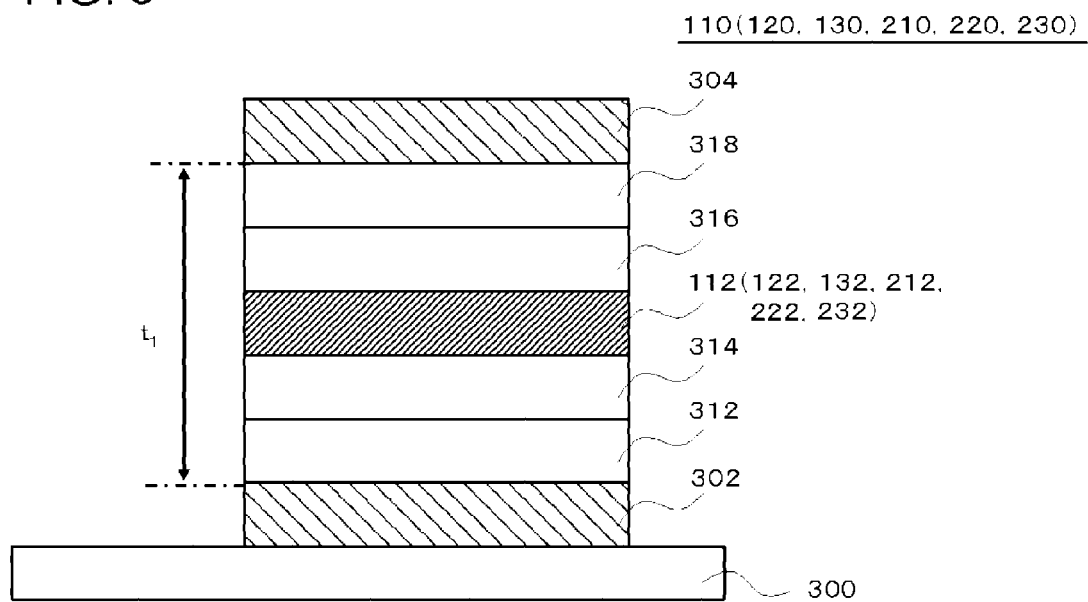
FIG. 5 is a cross-sectional view showing a layered constitution of a light-emitting element 110.

FIG. 5 is a cross-sectional view showing the layer constitution of the light-emitting element 110. In the example shown in this drawing, the light-emitting element 110 is an organic EL element. The light-emitting element 110 has a laminated structure in which a anode 302, a hole injection layer 312, a hole transportation layer 314, a light-emitting layer 112, an electron transportation layer 316, an electron injection layer 318, and a cathode 304 are sequentially laminated on a substrate 300.

In a case in which the light-emitting elements 120, 130, 210, 220, and 230 are organic EL elements, the light-emitting elements have the same layer constitution as the light-emitting element 110 except for the fact that the light-emitting layer 122, the light-emitting layer 132, the light-emitting layer 212, the light-emitting layer 222, or the light-emitting layer 232 is formed instead of the light-emitting layer 112. In a case in which the light-emitting elements included in the first light-emitting region 100 and the light-emitting elements included in the second light-emitting region 200 are all organic EL elements, it is possible to broaden the spectra of light rays emitted from the respective light-emitting elements and make the spectra close to the spectrum of the reference light of the color-rendering index. In this case, it is possible to particularly improve the color-rendering properties of the light-emitting device 10.

The substrate 300 is formed of, for example, a resin such as silica, glass, metal, or plastic. Of the anode 302 and the cathode 304, one is a transparent electrode such as indium tin oxide (ITO), indium zinc oxide (IZO), or zinc oxide (ZnO), and the other is formed of a metal such as Al.

The hole injection layer 312, the hole transportation layer 314, the light-emitting layer 112, the electron transportation layer 316, and the electron injection layer 318 maybe formed using any method of a coating method and a deposition method. In a case in which the components are formed using the deposition method, examples of materials for the respective layers include the following.

Examples of a phosphorescent organic compound used for the light-emitting layer 112 include bis(3,5-difluoro-2-(2-pyridyl)phenyl-(2-carboxypyridyl)iridium (III), tris(2-phenylpyridine)iridium (III), and bis(2-phenylbenzothiazolato) (acetylacetonate)iridium (III) which are indium complexes, osmium (II) bis(3-trifluoromethyl-5-(2-pyridyl)-pyrazolate)dimethylphenyl phosphine which is an osmium complex, tris(dibenzoylmethane)phenanthroline europium (III) of rare earth compounds, 2,3,7,8,12,13,17,18-octaethyl-21H,23H-porphine, which is a platinum complex, platinum (II), and the like.

In addition, examples of an organic compound having electron-transporting properties which serves as the main component of the light-emitting layer 112, the electron transportation layer 316, and the electron injection layer 318 include polycyclic compounds such as p-terphenyl or quaterphenyl and derivatives thereof, condensed polycyclic hydrocarbon compounds such as naphthalene, tetracene, pyrene, coronene, chrysene, anthracene, diphenyl anthracene, naphthacene, and phenanthrene and derivatives thereof, condensed heterocyclic compounds such as phenanthroline, bathophenanthroline, phenanthridine, acridine, quinoline, quinoxaline, and phenazine and derivatives thereof, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene, and derivatives thereof.

Furthermore, examples of the organic compound having electron-transporting properties also include metal chelate complex compounds, particularly, as metal-chelated oxanoide compounds, metal complexes having as a ligand at least one of 8-quinolinolato such as tris(8-quinolinolato) aluminum, bis(8-quinolinolato)magnesium, bis[benzo(f)-8-quinolinolato] zinc, bis(2-methyl-8-quinolinolato) (4-phenyl-phenolato)aluminum, tris(8-quinolinolato)indium, tris (5-methyl-8-quinolinolato)aluminum, 8-quinolinolatolithium, tris(5-chloro-8-quinolinolato)gallium, and bis(5-chloro-8-quinolinolato)calcium and derivatives thereof.

In addition, as the organic compound having electron-transporting properties, oxadiazoles, triazines, stilbene derivatives and distyrylarylene derivatives, styryl derivatives, and diolefin derivatives can be preferably used.

Furthermore, examples of an organic compound that can be used as the organic compound having electron-transporting properties include benzoxazol-based organic compounds such as 2,5-bis(5,7-di-t-pentyl-2-benzoxazolyl)-1,3,4-thiazole, 4,4'-bis(5,7-t-pentyl-2-benzoxazolyl)stilbene, 4,4'-bis [5,7-di(2-methyl-2-butyl)-2-benzoxazolyl]stilbene, 2,5-bis (5,7-di-t-pentyl-2-benzoxazolyl)thiophene, 2,5-bis[5-(α,α-dimethylbenzyl)-2-benzoxazolyl]thiophene, 2,5-bis[5,7-di (2-methyl-2-butyl)-2-benzoxazolyl]-3,4-diphenyl thiophene, 2,5-bis(5-methyl-2-benzoxazolyl)thiophene, 4,4'-bis(2-benzoxazolyl)biphenyl, 5-methyl-2-{2-[4-(5-methyl-2-benzoxazolyl)phenyl]vinyl}benzoxazole, 2-[2-(4-chlorophenyl)vinyl]naphtho(1,2-d)oxazole, benzothiazole-based organic compounds such as 2,2'-(p-phenylenedipynylene)-bis benzothiazole, 2-{2-[4-(2-benzoimidazolyl)phenyl]vinyl}benzoimidazole, and 2-[2-(4-carboxyphenyl)vinyl]benzoimidazole.

Furthermore, examples of the organic compound having electron-transporting properties also include 1,4-bis(2-methylstyryl)benzene, 1,4-bis(3-methylstyryl)benzene, 1,4-bis (4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, and 1,4-bis(2-methylstyryl)-2-ethylbenzene.

In addition, examples of the organic compound having electron-transporting properties also include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, and 2,5-bis[2-(1-pyrenyl)vinyl]pyrazine.

Additionally, as the organic compound having electron-transporting properties, it is possible to appropriately use a well-known organic compound used for the production of organic EL elements of the related art such as 1,4-phenylene-dimethylidine, 4,4'-phenylenedimethylidine, 2,5-xylylene-dimethylidine, 2,6-naphthylenedimethylidine, 1,4-biphenylene-dimethylidine, 1,4-p-terphenylenedimethylidine, 9,10-anthracenediyldimethylidine, 4,4'-(2,2-di-t-butylphenylvinyl)biphenyl, and 4,4'-(2,2-diphenylvinyl) biphenyl.

Meanwhile, examples of an organic compound which is used for the hole transportation layer 314 or hole-transporting light-emitting layers, and has hole-transporting properties include N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis (diphenylamino)quadriphenyl, 4-N,N-diphenylamino-(2-diphenylvinyl)benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri (p-tolyl)amine, 4-(di-p-tolylamino)-4'-[4-(di-p-tolylamino) styryl]stilbene, N,N,N',N'-tetra-p-toryl-4,4'-diaminobiphenyl, N,N,N',N'-tetraphenyl-4,4'-diaminobiphenyl, N-phenylcarbazole, 4,4'-bis[N-(1-naphthyl)-N-phenylamino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphtyl)-N-phenyl-amino]naphthalene, 4,4'-bis[N-(9-anthryl)-N-phenylamino]biphenyl, 4,4''-bis[N-(1-anthryl)-N-phenylamino]p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino) naphthalene, 2,6-bis[di-(1-naphthyl)amino]naphthalene, 2,6-bis[N-(1-naphthyl)-N-(2-naphthyl)amino]naphthalene, 4,4''-bis[N,N-di(2-naphthyl)amino]terphenyl, 4,4'-bis{N-phenyl-N-[4-(1-naphthyl)phenyl]amino}biphenyl, 4,4'-bis [N-phenyl-N-(2-pyrenyl)amino]biphenyl, 2,6-bis[N,N-di(2-naphthyl)amino]fluorene, 4,4''-bis(N,N-di-p-tolylamino) terphenyl, and bis(N-1-naphthyl) (N-2-naphthyl) amine.

Furthermore, as the organic compound having hole-transporting properties, substances obtained by dispersing the above-described organic compound in a polymer or polymerized substances of the above-described compounds can be used. It is also possible to use so-called π-conjugate polymers such as polyparaphenylene vinylene and derivatives thereof, hole-transporting non-conjugate polymers represented by poly(N-vinylcarbazole), and σ-conjugate polymers such as polysilanes.

Regarding the hole injection layer 312, there is no particular limitation, and it is possible to preferably use metal phthalocyanines such as copper phthalocyanine (CuPc), non-metal phthalocyanines, carbon films, and conductive polymers such as polyanilines.

The spectrum peak of a light ray emitted from the light-emitting element 110 can be changed by changing, for example, the material or film thickness of the light-emitting layer 112. In addition, it is also possible to change the spectrum peak of a light ray emitted from the light-emitting element 110 by changing the thickness $t_1$ between the anode 302 and the cathode 304. What has been described above can also be similarly applied to the light-emitting elements 120, 130, 210, 220, and 230.

According to the present embodiment, the light-emitting device 10 includes the first light-emitting region 100 and the second light-emitting region 200. Both the first light-emitting region 100 and the second light-emitting region 200 are capable of emitting light of the same color. In addition, at least one of the light-emitting layers 212, 222, and 232 included in the second light-emitting region 200 emits a light ray having a different spectrum peak from all of the light-emitting layers 112, 122, and 132 included in the first light-emitting region 100. Therefore, the light-rendering properties of light emitted from the light-emitting device 10 improve.

Particularly, in the present embodiment, the light-emitting elements 110, 120, 130, 210, 220, and 230 are formed in a striped pattern. In a case in which the light-emitting elements are repeatedly disposed in the same region, the disposition intervals between the same light-emitting elements (for example, the disposition intervals between the light-emitting elements 110) becomes wider than the resolution of the human eye, and there is a possibility that light emitted from the light-emitting device 10 does not look white. On the contrary, in the present embodiment, the light-emitting elements 110, 120, and 130 are formed in the first light-emitting region 100, and the light-emitting elements 210, 220, and 230 are formed in the second light-emitting region 200, and thus it is possible to suppress the occurrence of the above-described problem.

Figure 6:
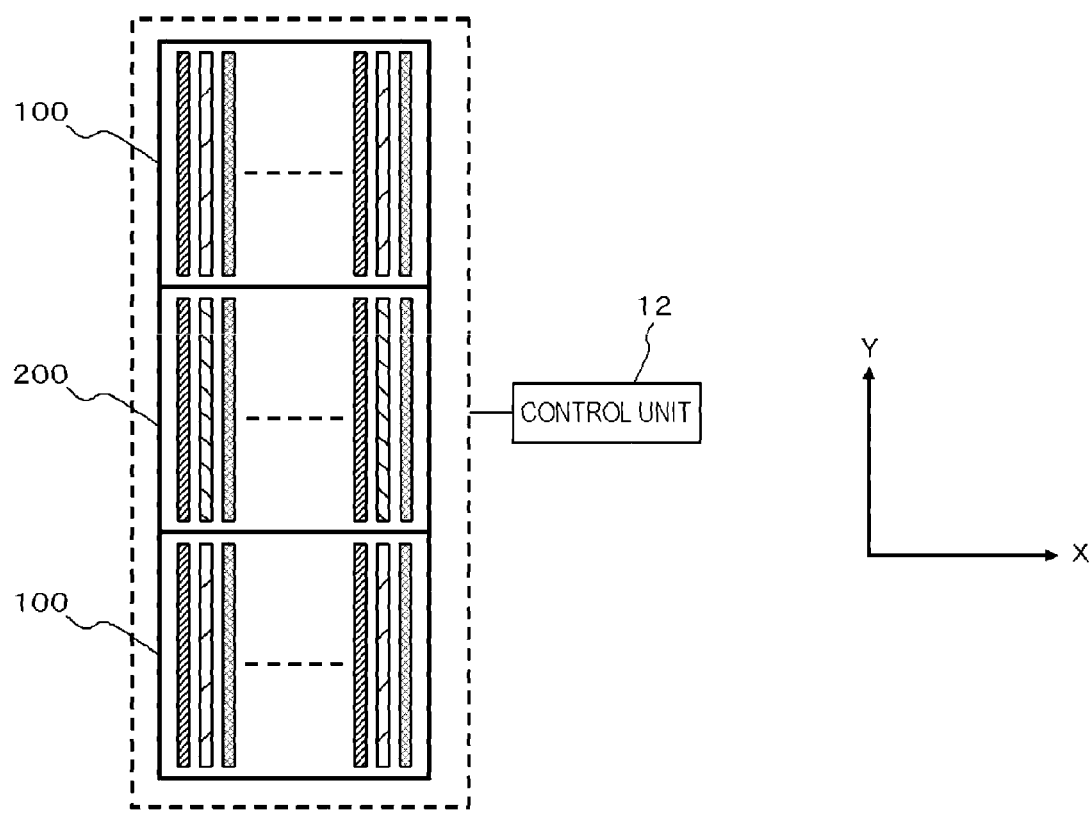
FIG. 6 is a plan view showing a second modified example.

The disposition of the first light-emitting region 100 and the second light-emitting region 200 is not limited to the example shown in FIG. 2. For example, as shown in FIG. 6, the first light-emitting region 100 and the second light-emitting region 200 may be alternatively disposed in a specified direction (the Y direction in the drawing).

(Second Embodiment)

Figure 7:
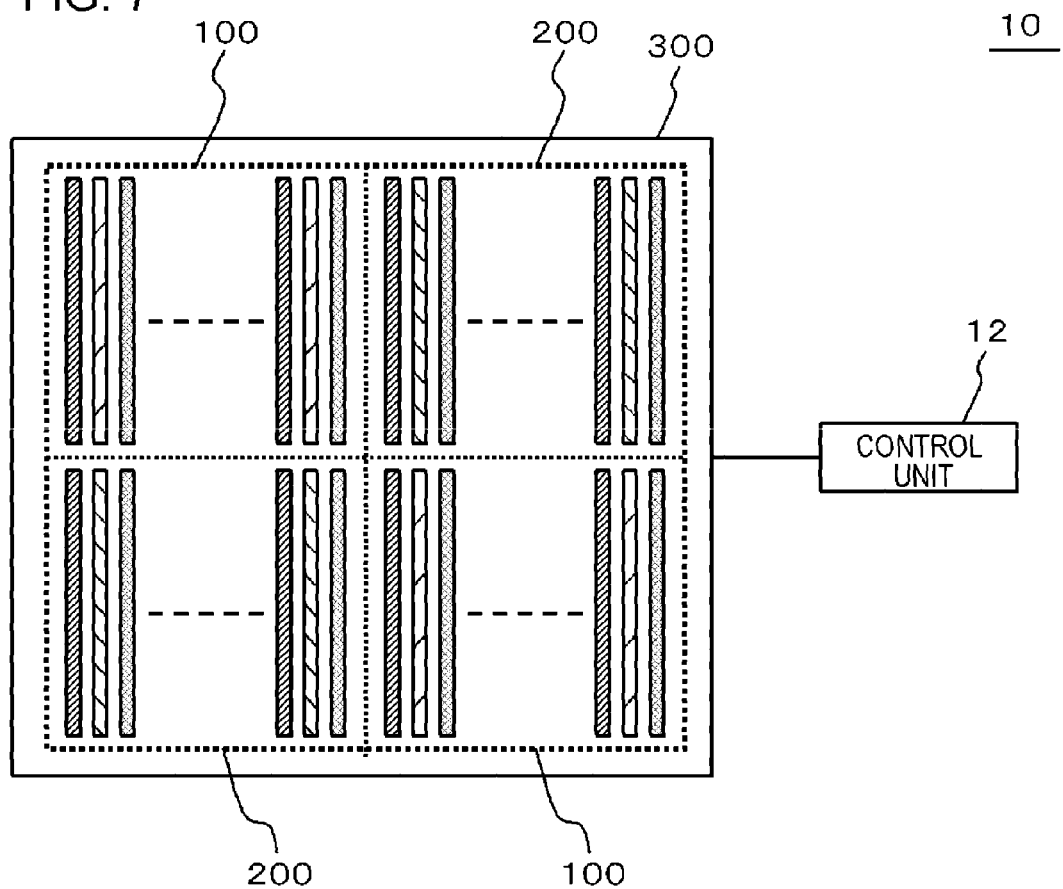
FIG. 7 is a plan view showing the constitution of the light-emitting device 10 according to a second embodiment.

FIG. 7 is a plan view showing the constitution of the light-emitting device 10 according to a second embodiment. The light-emitting device 10 according to the present embodiment has the same configuration as the light-emitting device 10 according to the first embodiment except for the fact that the substrate 300 of the first light-emitting region 100 and the substrate 300 of the second light-emitting region 200 form a single body.

Specifically, in a region of the substrate 300 which serves as the first light-emitting region 100, the light-emitting elements 110, 120, and 130 shown in FIG. 3 are repeatedly disposed. In addition, in a region of the substrate 300 which serves as the second light-emitting region 200, the light-emitting elements 210, 220, and 230 shown in FIG. 4 are repeatedly disposed.

Figure 8:
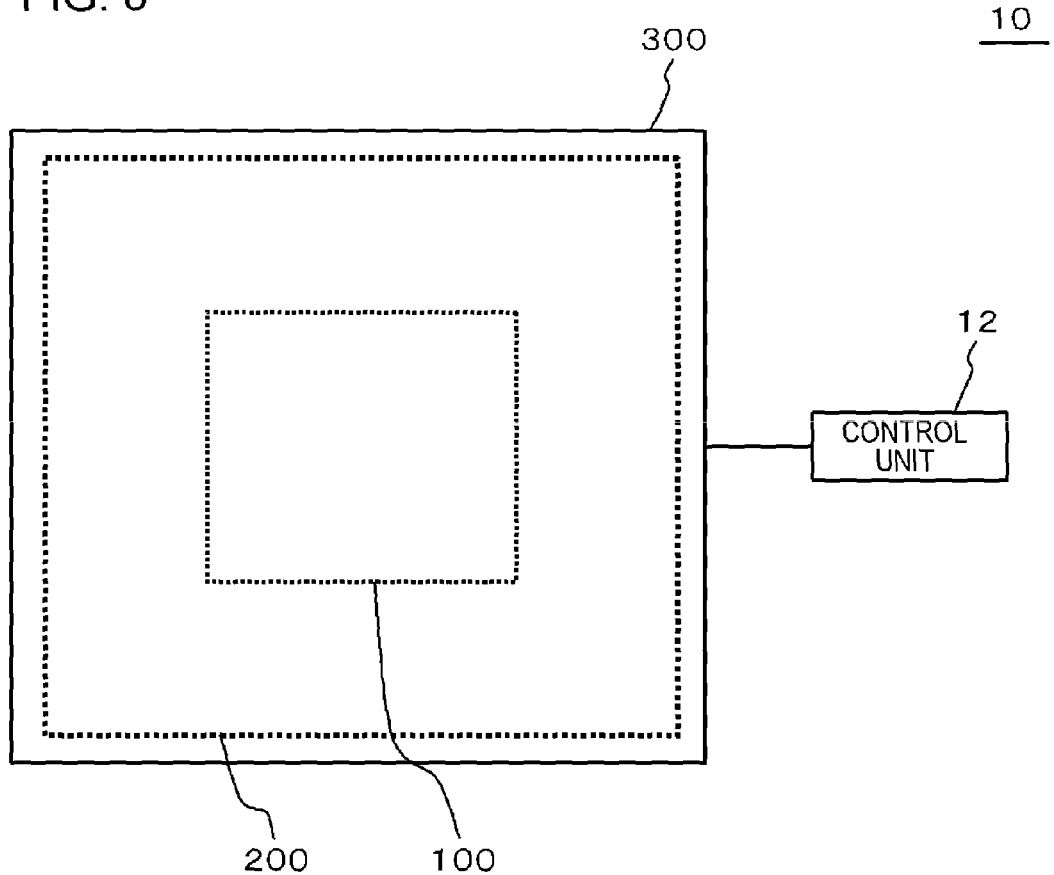
FIG. 8 is a plan view showing a modified example of FIG. 7.

As shown in FIG. 8, the first light-emitting region 100 and the second light-emitting region 200 may be disposed so that the second light-emitting region 200 surrounds the first light-emitting region 100.

In the present embodiment as well, it is possible to obtain the same effects as the first embodiment. In addition, since the first light-emitting region 100 and the second light-emitting region 200 are formed on the same substrate 300, the effort required to install the light-emitting device 10 at a desired position become small.

(Third Embodiment)

The light-emitting device 10 according to a third embodiment has the same configuration as the light-emitting device 10 according to the first embodiment except for the layout of the light-emitting layers included in the first light-emitting region 100 and the layout of the light-emitting layers included in the second light-emitting region 200.

Figure 9:
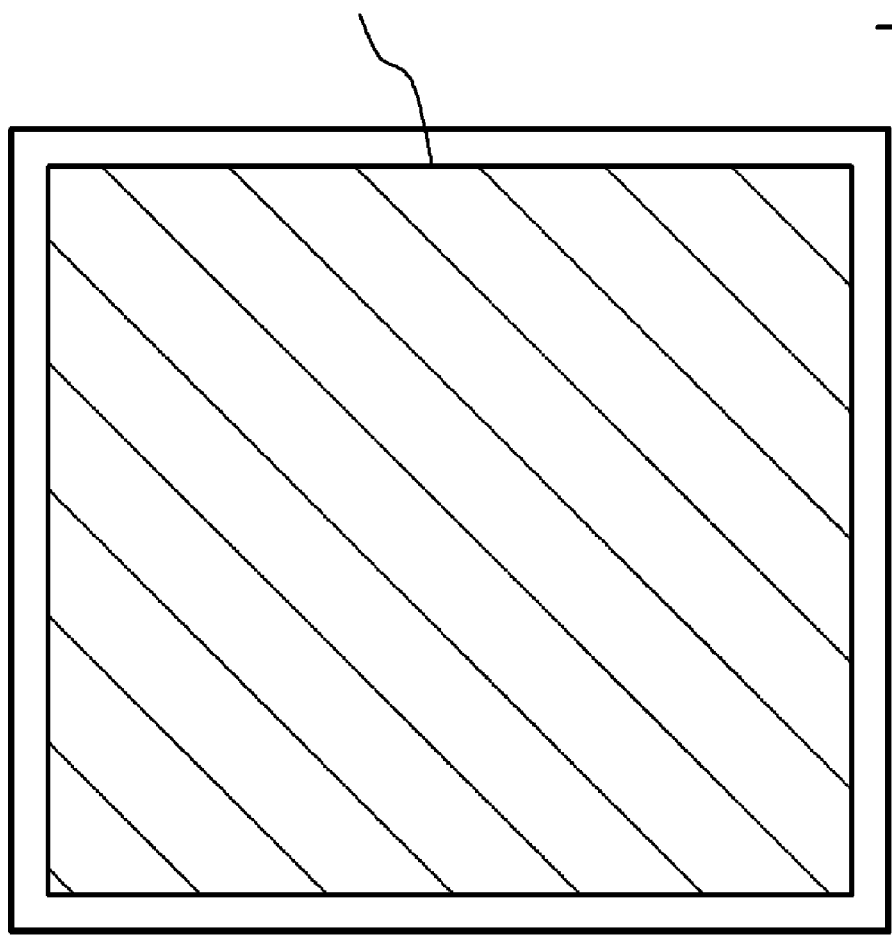
FIG. 9 is a plan view of the first light-emitting region 100 according to a third embodiment.

FIG. 9 is a plan view of the first light-emitting region 100 according to the present embodiment. In the present embodiment, the first light-emitting region 100 includes the light-emitting element 140 on almost the entire surface of the substrate 300. The light-emitting element 140 has a configuration in which the light-emitting layers 112, 122, and 132 are laminated together. That is, from the light-emitting element 140, overlapped light rays of a light ray emitted from the light-emitting layer 112, a light ray emitted from the light-emitting layer 122, and a light ray emitted from the light-emitting layer 132 are emitted.

Figure 10:
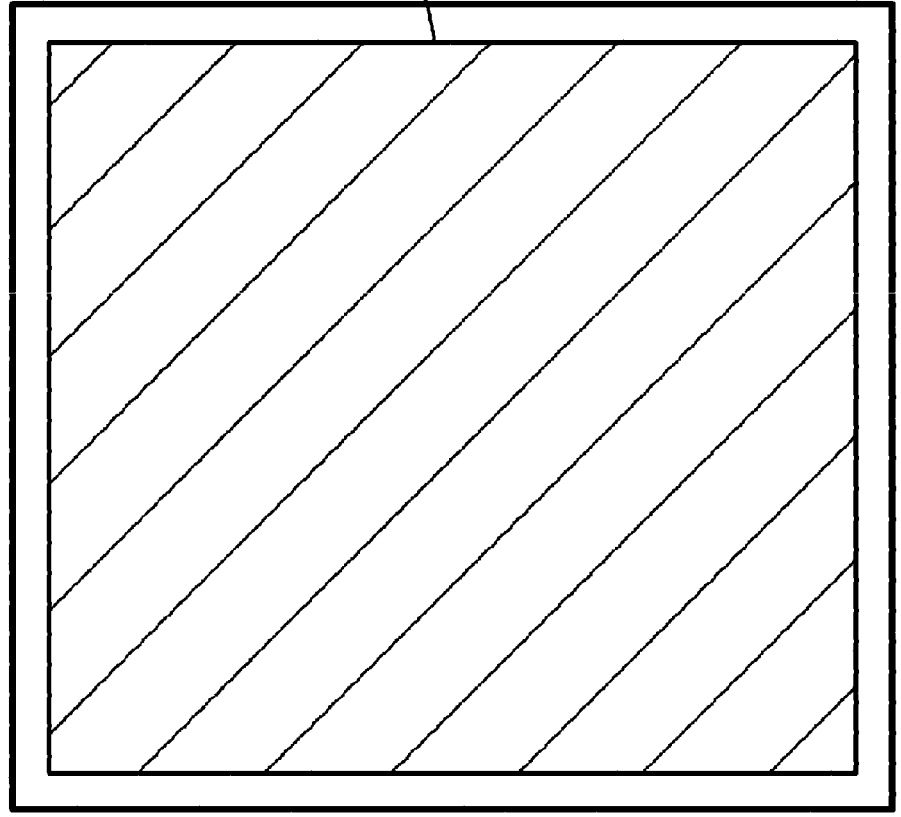
FIG. 10 is a plan view of the second light-emitting region 200 according to the third embodiment.

FIG. 10 is a plan view of the second light-emitting region 200 according to the present embodiment. In the present embodiment, the second light-emitting region 200 includes the light-emitting element 240 on almost the entire surface of the substrate 300. The light-emitting element 240 has a configuration in which the light-emitting layers 212, 222, and 232 are laminated together. That is, from the light-emitting element 240, overlapped light rays of a light ray emitted from the light-emitting layer 212, a light ray emitted from the light-emitting layer 222, and a light ray emitted from the light-emitting layer 232 are emitted.

Figure 11:
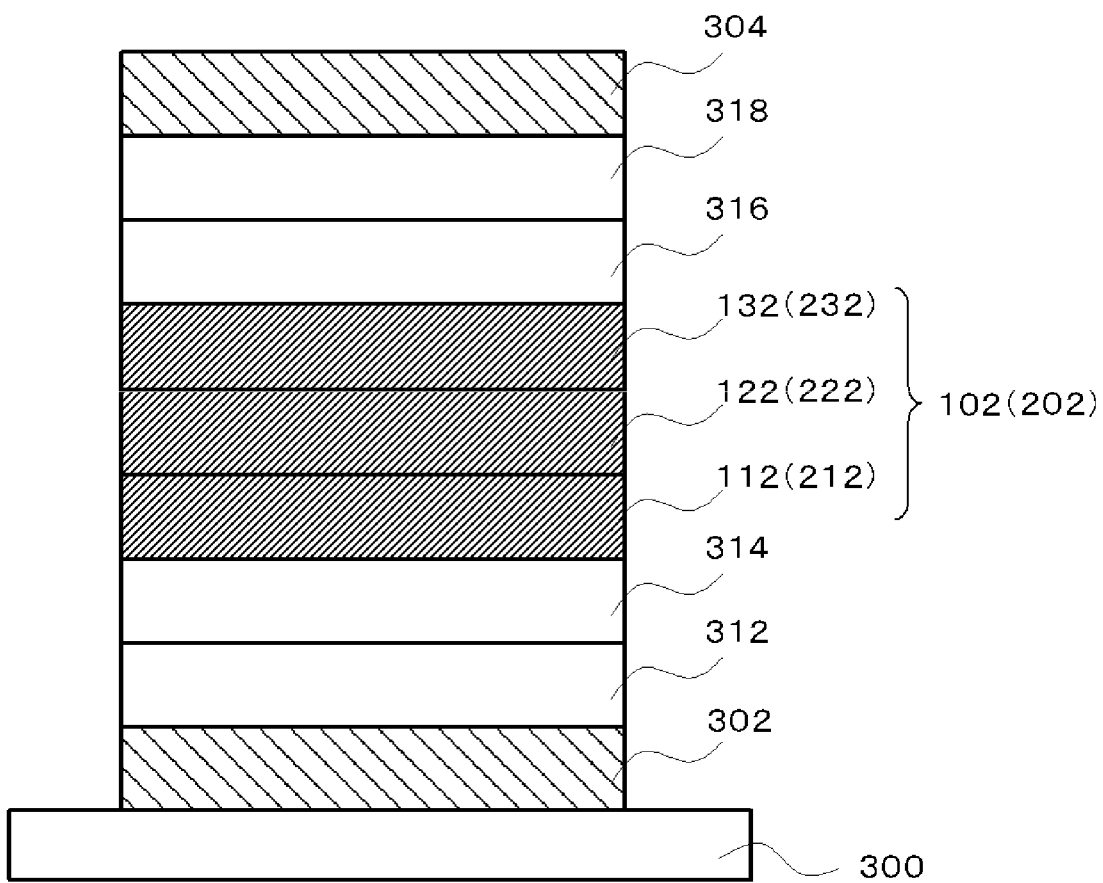
FIG. 11 is a cross-sectional view showing a first example of the constitution of a light-emitting element 140.

FIG. 11 is a cross-sectional view showing a first example of the constitution of the light-emitting element 140. The light-emitting element 140 exhibits a constitution in which the anode 302, the hole injection layer 312, the hole transportation layer 314, the light-emitting layer 112, the light-emitting layer 122, the light-emitting layer 132, the electron transportation layer 316, the electron injection layer 318, and the cathode 304 are sequentially laminated on the substrate 300. That is, the light-emitting layers 112, 122, and 132 are mutually overlapped between the anode 302 and the cathode 304. The light-emitting layers 112, 122, and 132 are mutually disposed in series.

Figure 12:
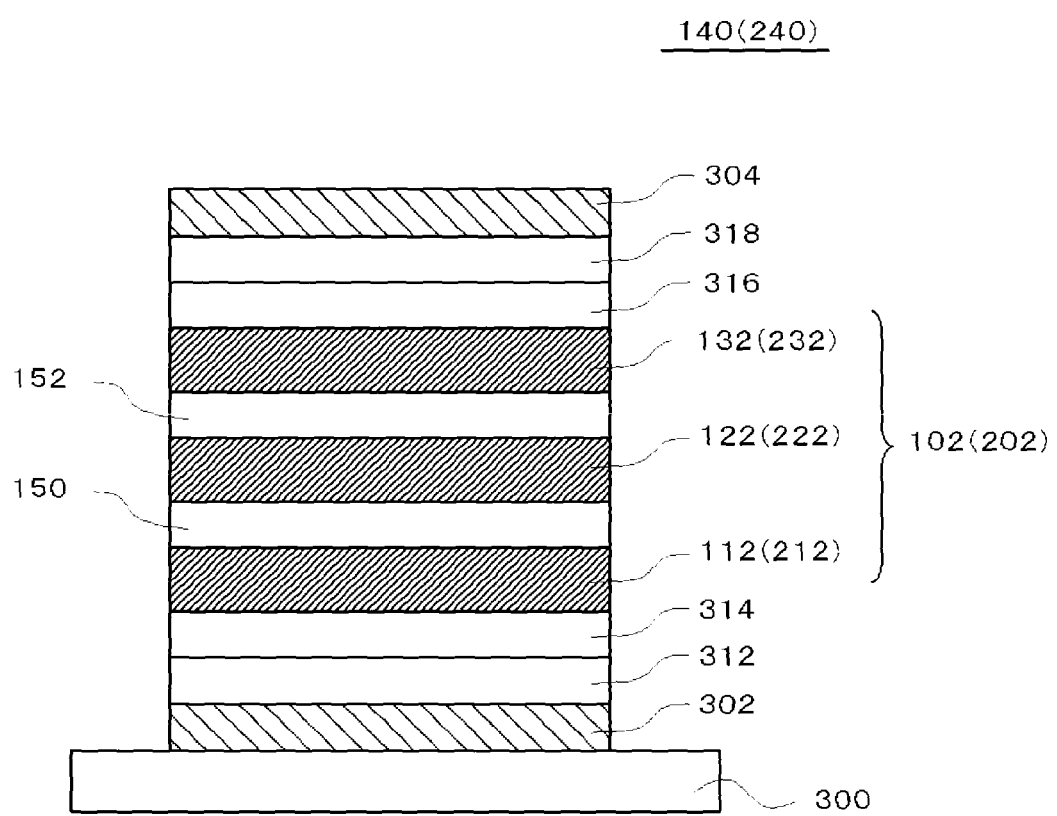
FIG. 12 is a cross-sectional view showing a second example of the constitution of the light-emitting element 140.

FIG. 12 is a cross-sectional view showing a second example of the constitution of the light-emitting element 140. The light-emitting element 140 in the present example is provided with a charge-generating layer 150 between the light-emitting layer 112 and the light-emitting layer 122, and has the same configuration as in the first example shown in FIG. 11 except for the fact that a charge-generating layer 152 is provided between the light-emitting layer 122 and the light-emitting layer 132. As the charge-generating layer 150 and the charge-generating layer 152, it is possible to use a material described in, for example, Patent Document 3.

In addition, the material, film thickness, and the like of the light-emitting layers 112, 122, and 132 are adjusted so that a light ray having the first color is emitted from the first light-emitting region 100.

The constitution of the light-emitting element 240 is the same as the constitution of the light-emitting element 140 shown in FIG. 11 or 12 except for the fact that the light-emitting layers 212, 222, and 232 are included instead of the light-emitting layers 112, 122, and 132. In addition, the material, film thickness, and the like of the light-emitting layers 212, 222, and 232 are adjusted so that a light ray having the first color is emitted from the second light-emitting region 200.

In the present embodiment, the light-emitting element 140 and the light-emitting element 240 may be formed in different regions on the same substrate 300 like the light-emitting device 10 according to the second embodiment.

According to the present embodiment as well, it is possible to obtain the same effects as the first embodiment. In addition, from the first light-emitting region 100, overlapped light rays of a light ray emitted from the light-emitting layer 112, a light ray emitted from the light-emitting layer 122, and a light ray emitted from the light-emitting layer 132 are emitted, and from the second light-emitting region 200, overlapped light rays of a light ray emitted from the light-emitting layer 212, a light ray emitted from the light-emitting layer 222, and a light ray emitted from the light-emitting layer 232 are emitted. Therefore, even at a position close to the light-emitting device 10, all of the light rays coming from the first light-emitting region 100 and the second light-emitting region 200 look like a first light.

Thus far, the embodiments of the present invention have been described with reference to the drawings, but the embodiments are merely examples of the present invention, and it is also possible to employ a variety of constitutions other than what has been described.

The invention claimed is:

1. A light-emitting device comprising:
a first light-emitting region including a first light-emitting layer group constituted of multiple kinds of light-emitting layers emitting light rays having mutually different spectrum peaks; and
a second light-emitting region including a second light-emitting layer group constituted of multiple kinds of light-emitting layers emitting light rays having mutually different spectrum peaks, the first light-emitting region adjacent to the second light-emitting region on a common substrate,
wherein at least one kind of light-emitting layer in the second light-emitting layer group emits a light ray having a different spectrum peak from all of the light-emitting layers in the first light-emitting group,
the first light-emitting region emits a first light ray having a first color by making the first light-emitting layer groups emit light,
the second light-emitting region emits a second light ray having the first color by making the second light-emitting layer groups emit light, and
wherein the first color is within a range of daylight color, natural white color, warm white color and incandescent light bulb color, based on Japan Industrial Standards (JIS).

2. A light-emitting device comprising:
a first light-emitting panel including a first light-emitting layer group constituted of multiple kinds of light-emitting layers emitting light rays having mutually different spectrum peaks;
a second light-emitting panel including a second light-emitting layer group constituted of multiple kinds of light-emitting layers emitting light rays having mutually different spectrum peaks, the first light-emitting layer group and the second light-emitting layer group being on mutually different substrates, and the first light-emitting panel being adjacent to the second light-emitting panel,
wherein at least one kind of light-emitting layer in the second light-emitting layer group emits a light ray having a different spectrum peak from all of the light-emitting layers in the first light-emitting group,
the first light-emitting panel emits a first light ray having a first color by making the first light-emitting layer groups emit light, and
the second light-emitting panel emits a second light ray having the first color by making the second light-emitting layer groups emit light; and
a control unit that controls a current value or a voltage applied to the first light- emitting layer group and the second light-emitting layer group, thereby causing light having the first color to be emitted from the first light-emitting panel and the second light-emitting panel.

3. The light-emitting device according to claim 2,
wherein, in an xy chromaticity diagram, the first color of the first light ray emitted from the first light-emitting panel and the first color of the second light ray emitted from the second light-emitting panel are included in a chromaticity range of the same color.

4. The light-emitting device according to claim 3,
wherein the light-emitting device is constituted of
the first light-emitting layer group made up of the multiple kinds of light-emitting layers formed in a striped pattern, and
the second light-emitting layer group made up of the multiple kinds of light-emitting layers formed in a striped pattern.

5. The light-emitting device according to claim 4,
wherein the first light-emitting layer group includes a light-emitting layer emitting red light, a light-emitting layer emitting green light, and a light-emitting layer emitting blue light, and
the second light-emitting layer group includes a light-emitting layer emitting red light, a light-emitting layer emitting yellow light, and a light-emitting layer emitting blue light.

6. The light-emitting device according to claim 5, further comprising:
a control unit that controls a current value or a voltage applied to the first light- emitting layer group and the second light-emitting layer group, thereby causing light having the first color to be emitted from the first light-emitting panel and the second light-emitting panel.

7. The light-emitting device according to claim 3, further comprising:
the first light-emitting layer group made up of multiple kinds of light-emitting layers that are mutually overlapped; and
the second light-emitting layer group made up of multiple kinds of light-emitting layers that are mutually overlapped.

8. The light-emitting device according to claim 7,
wherein the first light-emitting layer group includes a light-emitting layer emitting red light, a light-emitting layer emitting green light, and a light-emitting layer emitting blue light, and
the second light-emitting layer group includes a light-emitting layer emitting red light, a light-emitting layer emitting yellow light, and a light-emitting layer emitting blue light.

9. The light-emitting device according to claim 8, further comprising:
a control unit that controls a current value or a voltage applied to the first light-emitting layer group and the second light-emitting layer group, thereby causing light having the first color to be emitted from the first light-emitting panel and the second light-emitting panel.

10. The light-emitting device of claim 2, wherein the first color is within a range of daylight color, natural white color, warm white color and incandescent light bulb color, based on Japan Industrial Standards (JIS).

11. The light-emitting device according to claim 2, wherein the control unit controls an intensity of the first light emitting layer group independently from an intensity of the second light emitting layer group, by applying voltages, to determine the first color.

* * * * *